United States Patent
Hata et al.

(10) Patent No.: US 7,312,480 B2
(45) Date of Patent: Dec. 25, 2007

(54) SEMICONDUCTOR DEVICE AND METHOD OF FABRICATING THE SAME

(75) Inventors: Masayuki Hata, Hirakata (JP); Tatsuya Kunisato, Takatsuki (JP); Kouji Tominaga, Hirakata (JP); Yasuhiko Matsushita, Tottori (JP)

(73) Assignees: Sanyo Electric Co., Ltd., Moriguchi-shi (JP); Tottori Sanyo Electric Co., Ltd., Tottori-shi (JP)

( * ) Notice: Subject to any disclaimer, the term of this patent is extended or adjusted under 35 U.S.C. 154(b) by 16 days.

(21) Appl. No.: 11/175,310

(22) Filed: Jul. 7, 2005

(65) Prior Publication Data

US 2006/0017073 A1   Jan. 26, 2006

Related U.S. Application Data

(62) Division of application No. 09/425,731, filed on Oct. 22, 1999.

(30) Foreign Application Priority Data

Oct. 22, 1998   (JP)   ............................... 10-300996

(51) Int. Cl.
   *H01L 21/20* (2006.01)
(52) U.S. Cl. .................... 257/102; 117/106
(58) Field of Classification Search ............... 257/76, 257/78, 200, 201, 431; 117/97, 106, 952
   See application file for complete search history.

(56) References Cited

U.S. PATENT DOCUMENTS

| | | | |
|---|---|---|---|
| 5,042,043 A | 8/1991 | Hatano et al. ............ 372/45 |
| 5,122,845 A | 6/1992 | Manabe et al. ............ 357/17 |
| 5,290,393 A * | 3/1994 | Nakamura ................. 438/509 |
| 5,764,673 A | 6/1998 | Kawazu et al. ............ 372/45 |
| 5,787,104 A * | 7/1998 | Kamiyama et al. ...... 372/43.01 |
| 5,838,029 A * | 11/1998 | Shakuda .................... 257/190 |
| 5,862,167 A | 1/1999 | Sassa et al. ................ 372/45 |
| 5,863,811 A * | 1/1999 | Kawai et al. .............. 438/47 |

(Continued)

FOREIGN PATENT DOCUMENTS

JP   62-119940 A   6/1987

(Continued)

OTHER PUBLICATIONS

Notification of Reasons for Refusal in the counterpart Japanese Application (JP-10-300996) and its partial English translation thereof dated Feb. 4, 2003.

*Primary Examiner*—Thomas L. Dickey
(74) *Attorney, Agent, or Firm*—Edwards Angell Palmer & Dodge LLP

(57) ABSTRACT

A first buffer layer is formed on a substrate at a lower temperature than a single-crystal-growth-temperature, one or more of a layer composed of a nitride containing neither Ga nor In, a layer which has two or more thin films having different moduli of elasticity cyclically laminated therein, and a layer having an Al composition ratio which decreases and a Ga composition ratio which increases in a direction from the first buffer layer to a device-constituting layer are formed as a second buffer layer on the first buffer layer at the single-crystal-growth-temperature, and a device-constituting layer composed of a nitride semiconductor is formed on the second buffer layer.

4 Claims, 10 Drawing Sheets

U.S. PATENT DOCUMENTS

| | | | |
|---|---|---|---|
| 5,880,485 A * | 3/1999 | Marx et al. | 257/94 |
| 6,081,001 A | 6/2000 | Funato et al. | 257/94 |
| 2002/0054616 A1 * | 5/2002 | Kamiyama et al. | 372/45 |

FOREIGN PATENT DOCUMENTS

| JP | 02-303068 | 12/1990 |
|---|---|---|
| JP | 08-032116 | 2/1996 |
| JP | 09-083016 | 3/1997 |
| JP | 09-252163 | 9/1997 |
| JP | 09-293897 A | 11/1997 |
| JP | 10-51073 | 2/1998 |

* cited by examiner

F I G. 5
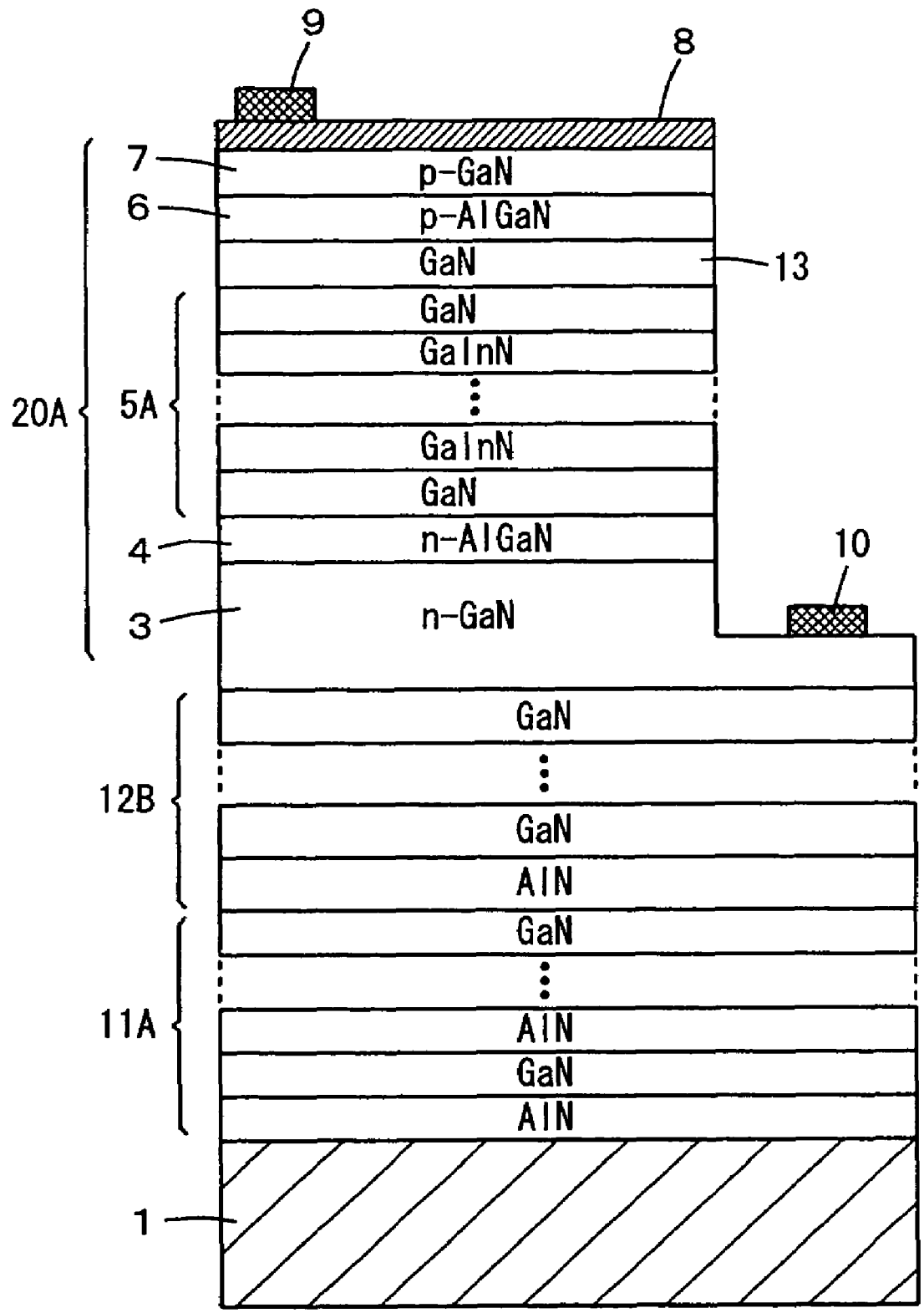

SEMICONDUCTOR DEVICE AND METHOD OF FABRICATING THE SAME

RELATED APPLICATION

This application is a divisional application of U.S. application Ser. No. 09/425,731, filed Oct. 22, 1999, the entire contents of which are incorporated herein by reference.

BACKGROUND OF THE INVENTION

1. Field of the Invention

The present invention relates to a semiconductor device using a III-V group compound semiconductor and particularly, a nitride semiconductor containing gallium which is expressed by a general formula of $In_{1-x-y}Al_xGa_yN$ (0 y 1 and 0 x+y 1), and a method of fabricating the same.

2. Description of the Background Art

It has been expected that a semiconductor device using a nitride semiconductor such as GaN, InGaN, AlGaN, or AlGaInN is applied to a light receiving element and a light emitting element for receiving and emitting light in a region from a visible region to a ultraviolet region, and an environmental resistance electronic device used under high temperatures, a high-frequency and high-power electronic device used for mobile communication, or the like.

In the above-mentioned semiconductor device using the nitride semiconductor, a nitride-semiconductor layer is formed on a substrate composed of sapphire, spinel, Si, SiC, GaP, GaAs, or the like using MOVPE (Metal Organic Vapor Phase Epitaxy), MBE (Molecular Beam Epitaxy), HVPE (Halide Vapor Phase Epitaxy), or the like. The difference between the lattice constant of the substrate and the lattice constant of the nitride-semiconductor layer is large. If the nitride-semiconductor layer is directly formed on the substrate, therefore, it is difficult for the nitride-semiconductor layer to have good crystalline quality. In order to solve the problem caused by the difference in the lattice constant, the nitride-semiconductor layer is formed on the substrate through a buffer layer composed of AlN or GaN in the conventional semiconductor device, as disclosed in JP-A-2-81482 and JP-A-8-64868.

FIG. 10 is a schematic sectional view showing the construction of a light emitting diode which is an example of the above-mentioned conventional semiconductor device using the nitride semiconductor.

In the light emitting diode shown in FIG. 10, a buffer layer 102 composed of AlN or GaN, an n-type contact layer 103 composed of n-type GaN, an n-type cladding layer 104 composed of n-type AlGaN, a light-emitting layer 105 composed of GaInN, a p-type cladding layer 106 composed of p-type AlGaN, and a p-type contact layer 107 composed of p-type GaN are successively formed on a substrate 101 composed of sapphire, spinel, Si, SiC, GaP, GaAs, or the like. A device-constituting layer 120 constituting a device portion of the light emitting diode comprises the n-type contact layer 103, the n-type cladding layer 104, the light-emitting layer 105, the p-type cladding layer 106, and the p-type contact layer 107.

A p-side electrode 108 having transparency is formed on the p-type contact layer 107, a pad electrode 109 is formed thereon, and an n-side electrode 110 is formed on the n-type contact layer 103.

As described above, in the conventional light emitting diode, the crystalline quality of the device-constituting layer 120 is made better by forming the device-constituting layer 120 on the substrate 101 through the buffer layer 102, thereby improving the luminous characteristics of the light emitting diode.

In the conventional light emitting diode, however, the following problems arise because the buffer layer 102 is formed at a lower temperature than a single-crystal-growth-temperature.

First, the buffer layer 102 formed at such a lower temperature has a lot of defects such as unbonding joints or grain boundaries because it is in an amorphous or polycrystalline state. Since the defects are propagated to the device-constituting layer 120 at the time of forming the device-constituting layer 120, therefore, it is impossible for the device-constituting layer 120 to have good crystalline quality.

When the device-constituting layer 120 is formed on the buffer layer 102 formed at the low temperature, In (indium) atoms or Ga (gallium) atoms are easily concentrated on a particular portion upon being diffused through a crystal growth plane of the buffer layer 102 in the early stages of formation. In the early stages of formation, therefore, the device-constituting layer 120 is grown as crystals in an island shape around the particular portion. Accordingly, a lot of defects such as grain boundaries or nano-pipes occur, thereby degrading the crystalline quality of the device-constituting layer 120.

Furthermore, a nitride containing Ga or In, for example, GaN or InN generally has the property of easy desorption of N (nitrogen). When the device-constituting layer 120 is formed on the buffer layer 102 formed at the low temperature, therefore, nitrogen is desorbed particularly from the microcrystals grown in an island shape in the vicinity of the interface of the device-constituting layer 120 and the buffer layer 102, thereby causing a new defect. As a result, the defect is propagated through the device-constituting layer 120, to reach the top thereof, thereby degrading the crystalline quality of the entire device-constituting layer 120.

SUMMARY OF THE INVENTION

An object of the present invention is to provide a semiconductor device having superior device characteristics obtained by improving the crystalline quality of a device-constituting layer composed of a nitride semiconductor and a method of fabricating the same.

A semiconductor device according to an aspect of the present invention comprises a substrate; a first buffer layer in a non-single crystalline state; a second buffer layer in an approximately single crystalline state composed of a nitride containing neither Ga nor In; and a device-constituting layer composed of a nitride semiconductor in this order.

In the semiconductor device, the second buffer layer is in the approximately single crystalline state. Accordingly, the number of defects existing in the second buffer layer is smaller than that in a buffer layer in an amorphous or polycrystalline state, so that the second buffer layer has good crystalline quality. Further, the second buffer layer is composed of the nitride containing neither Ga nor In. Accordingly, it is possible to restrain desorption of nitrogen and island-shaped crystal growth which are caused by surface diffusion of Ga atoms and In atoms. As a result, the crystalline quality of the device-constituting layer composed of the nitride semiconductor can be made better, so that the semiconductor device has superior device characteristics.

It is preferable that the second buffer layer is composed of $Al_{1-x}B_xN$ (0 x 1). In this case, it is easy to fabricate the second buffer layer.

A semiconductor device according to another aspect of the present invention comprises a substrate; a first buffer layer in a non-single crystalline state; a second buffer layer in an approximately single crystalline state which has two or more thin films having different moduli of elasticity cyclically laminated therein; and a device-constituting layer composed of a nitride semiconductor in this order.

In the semiconductor device, the second buffer layer is in the approximately single crystalline state. Accordingly, the number of defects existing in the second buffer layer is smaller than that in a buffer layer in an amorphous or polycrystalline state, so that the second buffer layer has good crystalline quality. Further, the second buffer layer is formed of a multi-layer film which has two or more of the thin films having different moduli of elasticity cyclically laminated therein. Accordingly, the direction in which the defects are propagated from the second buffer layer to the device-constituting layer can be changed in an in-plane direction in the interface of the multi-layer film. Consequently, the amount of the defects which are propagated to the device-constituting layer can be reduced, thereby making it possible to improve the crystalline quality of the device-constituting layer. As a result, the crystalline quality of the device-constituting layer composed of the nitride semiconductor can be made better, so that the semiconductor device has superior device characteristics.

It is preferable that the second buffer layer comprises first nitride films and second nitride films which are alternately laminated, the first nitride film has an Al composition ratio higher than that of the second nitride film, and the second nitride film has a Ga composition ratio higher than that of the first nitride film. In this case, the composition of the second nitride film can be made closer to GaN than the composition of the first nitride film. Consequently, lattice mismatching between the second buffer layer and the device-constituting layer can be alleviated, thereby making it possible to further improve the crystalline quality of the device-constituting layer.

It is preferable that the thickness of the first nitride film gradually decreases in a direction from the first buffer layer to the device-constituting layer, and the thickness of the second nitride film gradually increases in a direction from the first buffer layer to the device-constituting layer. In this case, the average composition along the thickness of the second buffer layer can be gradually changed from a composition close to AlN to a composition close to GaN. Consequently, lattice mismatching between the second buffer layer and the device-constituting layer can be alleviated, thereby making it possible to further improve the crystalline quality of the device-constituting layer.

It is preferable that the first nitride film and the second nitride film are formed in this order on the first buffer layer. In this case, the composition, on the side of the device-constituting layer, of the second buffer layer can be a composition close to GaN.

It is preferable that the first nitride film is composed of AlN, and the second nitride film is composed of GaN. In this case, a portion, on the side of the device-constituting layer, of the second buffer layer, can be GaN.

A semiconductor device according to still another aspect of the present invention comprises a substrate; a first buffer layer in a non-single crystalline state; a second buffer layer in an approximately single crystalline state; and a device-constituting layer composed of a nitride semiconductor in this order. The second buffer layer has an Al composition ratio which decreases and a Ga composition ratio which increases in a direction from the first buffer layer to the device-constituting layer.

In the semiconductor device, the second buffer layer is in the approximately single crystalline state. Accordingly, the number of defects existing in the second buffer layer is smaller than that in a buffer layer in an amorphous or polycrystalline state, so that the second buffer layer has good crystalline quality. Further, the second buffer layer has a composition distribution in which an Al composition ratio decreases and a Ga composition ratio increases in the direction from the first buffer layer to the device-constituting layer. Accordingly, lattice mismatching between the first buffer layer and the device-constituting layer can be alleviated, thereby making it possible to improve the crystalline quality of the device-constituting layer. As a result, the crystalline quality of the device-constituting layer composed of the nitride semiconductor can be made better, so that the semiconductor device has superior device characteristics.

A semiconductor device according to a further aspect of the present invention comprises a substrate; a first buffer layer in a non-single crystalline state; a second buffer layer in an approximately single crystalline state; and a device-constituting layer composed of a nitride semiconductor in this order. The second buffer layer comprises two or more layers selected from a layer composed of a nitride containing neither Ga nor In, a layer which has two or more thin films having different moduli of elasticity cyclically laminated therein, and a layer having an Al composition ratio which decrease and a Ga composition ratio which increases in a direction from the first buffer layer to the device-constituting layer in this order.

In the semiconductor device, the second buffer layer is in the approximately single crystalline state. Accordingly, the number of defects existing in the second buffer layer is smaller than that in a buffer layer in an amorphous or polycrystalline state, so that the second buffer layer has good crystalline quality. Further, two or more of the three layers are used as the second buffer layer. Accordingly, it is possible to synergically produce the effects of restraining island-shaped crystal growth and desorption of nitrogen, reducing the propagation of the defects, and alleviating lattice mismatching by each of the layers, thereby making it possible to improve the crystalline quality of the device-constituting layer. As a result, the crystalline quality of the device-constituting layer composed of the nitride semiconductor can be made better, so that the semiconductor device has superior device characteristics.

It is preferable that the second buffer layer comprises among the two or more layers an intermediate layer having a lattice constant closer to the lattice constant of the device-constituting layer than the layer, on the side of the first buffer layer, out of the two or more layers. In this case, the difference in the lattice constant between the intermediate layer and the device-constituting layer is small, thereby making it possible to prevent the crystalline quality of the device-constituting layer from being degraded by the lattice mismatching.

It is preferable that in each of the above-mentioned semiconductor devices, the first buffer layer is formed of a single layer film or a multi-layer film composed of a nitride containing at least one of Al, Ga, In, B and Tl, SiC or ZnO.

A method of fabricating a semiconductor device according to another aspect of the present invention comprises the steps of forming a first buffer layer on a substrate at a lower temperature than a single-crystal-growth-temperature; forming on the first buffer layer a second buffer layer composed of a nitride containing neither Ga nor In at the single-crystal-growth-temperature; and forming a device-constituting layer composed of a nitride semiconductor on the second buffer layer.

In the method of fabricating the semiconductor device, the second buffer layer is formed at the single-crystal-growth-temperature, to be grown in approximately single crystalline state. Accordingly, the number of defects existing in the second buffer layer is smaller than that in a buffer layer in an amorphous or polycrystalline state, thereby making it possible for the second buffer layer to have good crystalline quality. Further, the second buffer layer is composed of the nitride containing neither Ga nor In. Accordingly, it is possible to restrain desorption of nitrogen and island-shaped crystal growth which are caused by surface diffusion of Ga atoms and In-atoms. As a result, the crystalline quality of the device-constituting layer composed of the nitride semiconductor can be made better, so that the semiconductor device has superior device characteristics.

It is preferable that the step of forming the second buffer layer comprises the step of forming a layer composed of $Al_{1-x}B_xN$ (0 x 1). In this case, it is easy to fabricate the second buffer layer.

A method of fabricating a semiconductor device according to still another aspect of the present invention comprises the step of forming a first buffer layer on a substrate at a lower temperature than a single-crystal-growth-temperature; forming on the first buffer layer a second buffer layer which has two or more thin films having different moduli of elasticity cyclically laminated therein at the single-crystal-growth-temperature; and forming a device-constituting layer composed of a nitride semiconductor on the second buffer layer.

In the method of fabricating the semiconductor device, the second buffer layer is formed at the single-crystal-growth-temperature, to be grown in approximately single crystalline state. Accordingly, the number of defects existing in the second buffer layer is smaller than that in a buffer layer in an amorphous or polycrystalline state, thereby making it possible for the second buffer layer to have good crystalline quality. Further, the second buffer layer is formed of a multi-layer film which has two or more of the thin films having different moduli of elasticity cyclically laminated therein. Accordingly, the direction in which the defects are propagated from the second buffer layer to the device-constituting layer can be changed in an in-plane direction in the interface of the multi-layer film. Consequently, the amount of the defects which are propagated to the device-constituting layer can be reduced, thereby making it possible to improve the crystalline quality of the device-constituting layer. As a result, the crystalline quality of the device-constituting layer composed of the nitride semiconductor can be made better, so that the semiconductor device has superior device characteristics.

It is preferable that the step of forming the second buffer layer comprises the step of alternately laminating first nitride films and second nitride films such that the first nitride film has an Al composition ratio higher than that of the second nitride film, and the second nitride film has a Ga composition ratio higher than that of the first nitride film.

It is preferable that the step of forming the second buffer layer comprises the step of alternately laminating the first nitride films and the second nitride films such that the thickness of the first nitride film gradually decreases in a direction from the first buffer layer to the device-constituting layer, and the thickness of the second nitride film gradually increases in a direction from the first buffer layer to the device-constituting layer.

It is preferable that the step of forming the second buffer layer comprises the step of forming an AlN film as the first nitride film, and forming a GaN film as the second nitride film.

A method of fabricating a semiconductor device according to a further aspect of the present invention comprises the steps of forming a first buffer layer on a substrate at a lower temperature than a single-crystal-growth-temperature; forming a second buffer layer on the first buffer layer at the single-crystal-growth-temperature; and forming a device-constituting layer composed of a nitride semiconductor on the second buffer layer. The step of forming the second buffer layer comprises the step of forming a layer having an Al composition ratio which decreases and a Ga composition ratio which increases in a direction from the first buffer layer to the device-constituting layer.

In the method of fabricating the semiconductor device, the second buffer layer is formed at the single-crystal-growth-temperature, to be grown in approximately single crystalline state. Accordingly, the number of defects existing in the second buffer layer is smaller than that in a buffer layer in an amorphous or polycrystalline state, thereby making it possible for the second buffer layer to have good crystalline quality. Further, the second buffer layer is formed of a layer having a composition distribution in which an Al composition ratio decreases and a Ga composition ratio increases in the direction from the first buffer layer to the device-constituting layer. Accordingly, lattice mismatching between the first buffer layer and the device-constituting layer can be alleviated, thereby making it possible to improve the crystalline quality of the device-constituting layer. As a result, the crystalline quality of the device-constituting layer composed of the nitride semiconductor can be made better, so that the semiconductor device has superior device characteristics.

A method of fabricating a semiconductor device according to a still further aspect of the present invention comprises the steps of forming a first buffer layer on a substrate at a lower temperature than a single-crystal-growth-temperature; forming a second buffer layer on the first buffer at the single-crystal-growth-temperature; and forming a device-constituting layer composed of a nitride semiconductor on the second buffer layer. The step of forming the second buffer layer comprises the step of forming two or more layers selected from a layer composed of a nitride containing neither Ga nor In, a layer which has two or more thin films having different moduli of elasticity cyclically laminated therein, and a layer having an Al composition ratio which decreases and a Ga composition ratio which increases in a direction from the first buffer layer to the device-constituting layer.

In the method of fabricating the semiconductor device, the second buffer layer is formed at the single-crystal-growth-temperature, to be grown in approximately single crystalline state. Accordingly, the number of defects existing in the second buffer layer is smaller than that in a buffer layer in an amorphous or polycrystalline state, thereby making it possible for the second buffer layer to have good crystalline quality. The second buffer layer is formed of two or more of the three layers. Accordingly, it is possible to synergically produce the effects of restraining island-shaped crystal growth and desorption of nitrogen, reducing the propagation of the defects, and alleviating lattice mismatching by each of the layers, thereby making it possible to improve the crystalline quality of the device-constituting layer. As a result, the crystalline quality of the device-constituting layer composed of the nitride semiconductor can be made better, so that the semiconductor device has superior device characteristics.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic sectional view of a light emitting diode in a third embodiment of the present invention;

DESCRIPTION OF THE PREFERRED EMBODIMENTS

A light emitting diode will be described as an example of a semiconductor device according to the present invention. The light emitting diode according to a first embodiment of the present invention will be described with reference to FIG. 1.

Figure 1:
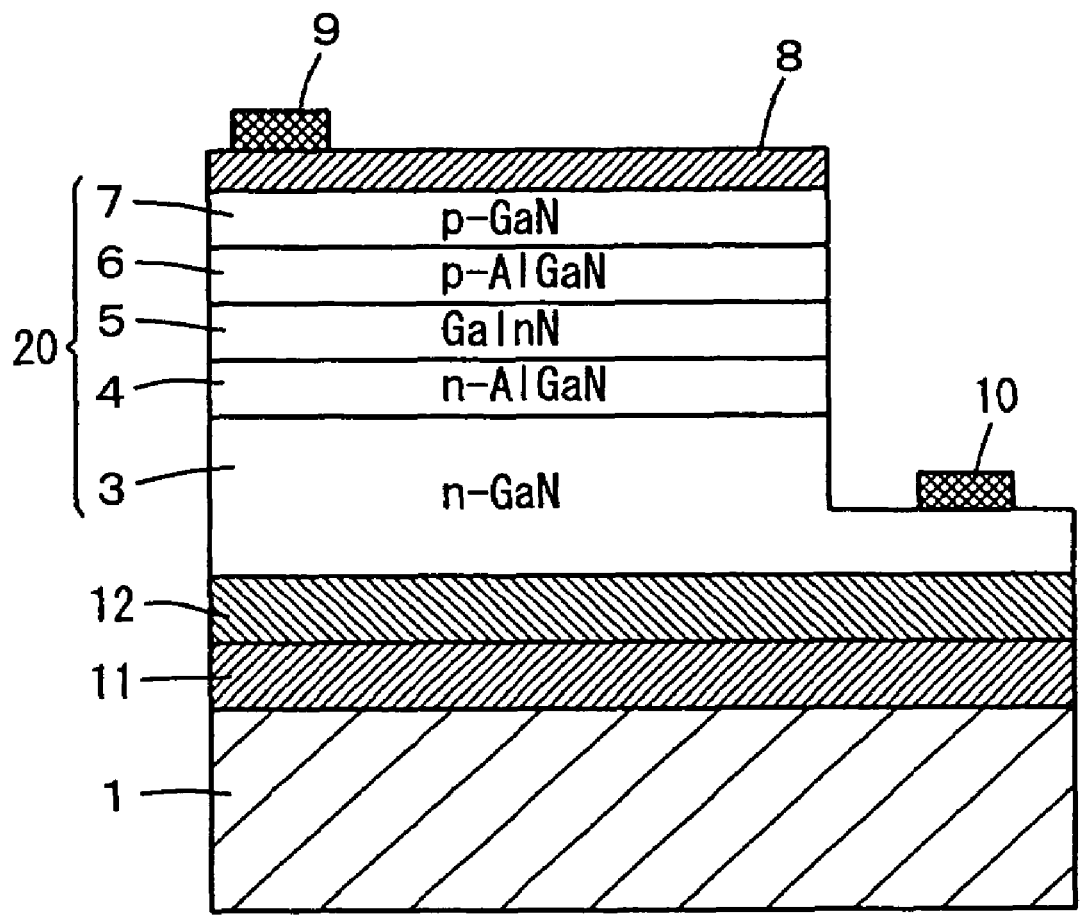
FIG. 1 is a schematic sectional view of a light emitting diode in a first embodiment of the present invention.

In the light emitting diode shown in FIG. 1, a first buffer layer 11 in a non-single crystalline state which is formed at a lower temperature than a single-crystal-growth-temperature, a second buffer layer 12 in an approximately single crystalline state which is formed at the single-crystal-growth-temperature, an n-type contact layer 3 composed of n-type GaN, an n-type cladding layer 4 composed of n-type AlGaN, a light-emitting layer 5 composed of GaInN, a p-type cladding layer 6 composed of p-type AlGaN, and a p-type contact layer 7 composed of p-type GaN are formed in this order on a substrate 1 composed of sapphire, spinel, Si, SiC (silicon carbide), GaP, GaAs, or the like. The n-type contact layer 3, the n-type cladding layer 4, the light-emitting layer 5, the p-type cladding layer 6, and the p-type contact layer 7 constitute a device-constituting layer 20 constituting a device portion of the light emitting diode.

A p-side electrode 8 having transparency is formed on the p-type contact layer 7, a pad electrode 9 is formed thereon, and an n-side electrode 10 is formed on the n-type contact layer 3.

As described in the foregoing, in the light emitting diode shown in FIG. 1, the second buffer layer 12 formed at the single-crystal-growth-temperature is provided on the first buffer layer 11 formed at the lower temperature than the single-crystal-growth-temperature, and the device-constituting layer 20 is formed on the second buffer layer 12.

The first buffer layer 11 is a layer formed at the lower temperature than the single-crystal-growth-temperature, and can be formed of a single layer film composed of one of a nitride containing at least one of Al, Ga, In, B and Tl (a nitride semiconductor such as AlN, AlGaN, GaN, GaInN, AlGaInN, etc.), SiC (silicon carbide) and ZnO (zinc oxide) or a multi-layer film having two or more single layer films.

The second buffer layer 12 is a layer formed at the single-crystal-growth-temperature. It is preferable that the single-crystal-growth-temperature of the second buffer layer 12 is approximately 1000 to 1200° C. The second buffer layer 12 can be composed of a nitride containing neither Ga nor In, for example, a nitride expressed by $Al_{1-x}B_xN$ (0 x 1), such as AlN, AlBN, or BN.

In the present embodiment, the device-constituting layer 20 is formed on the above-mentioned second buffer layer 12, thereby producing the following effects.

First, the second buffer layer 12 is formed at the single-crystal-growth-temperature, so that the structure thereof is in the approximately single crystalline state. Accordingly, the number of defects existing in the second buffer layer 12 is smaller than that in a conventional buffer layer in an amorphous or polycrystalline state. Consequently, the second buffer layer 12 in the present embodiment has better crystalline quality than the conventional buffer layer.

Since the device-constituting layer 20 is formed on the buffer layer 12 in the approximately single crystalline state and having good crystalline quality, it is possible to restrain island-shaped crystal growth and desorption of nitrogen which have conventionally occur, thereby further improving the crystalline quality of the device-constituting layer 20.

Furthermore, the second buffer layer 12 is composed of a nitride containing neither Ga nor In, for example, a nitride expressed by $Al_{1-x}B_xN$ (0 x 1), such as AlN, AlBN, or BN. In forming the second buffer layer 12 on the first buffer layer 11, therefore, it is possible to restrain the above-mentioned desorption of nitrogen and island-shaped crystal grown which are caused by surface diffusion of Ga atoms and In atoms. Consequently, it is possible to reduce the number of defects which are caused by the crystal growth and the desorption of nitrogen, thereby making it possible to further improve the crystalline quality of the second buffer layer 12.

In the present invention, the single-crystal-growth-temperature shall mean a temperate at which a film in an approximately single crystalline state can be formed. The approximately single crystalline state shall include a state where the whole is in a single crystalline state, and a state where most of the whole is in an approximately single crystalline state, although a part (a portion particularly formed in the initial stages of formation, for example) of the whole is in an amorphous state and/or a polycrystalline state. A nitride containing neither Ga nor In shall also include a nitride containing a very small amount of Ga and/or In, provided that the crystalline quality thereof is hardly changed.

In order to prepare a first sample in the present embodiment, a first buffer layer 11 and a second buffer layer 12 were successively formed on a sapphire substrate 1, and an undoped GaN layer was directly formed on the second buffer layer 12. The crystalline quality of the GaN layer in the first sample was evaluated by X-ray diffraction and measurement of photoluminescence (PL). In the sample, a laminate film obtained by alternately laminating AlN films each having a thickness of approximately 2.5 nm and GaN films each having a thickness of approximately 2.5 nm in four cycles was used as the first buffer layer 11, and an AlN film having a thickness of approximately 0.1 μm was used as the second buffer layer 12.

The first sample was fabricated in the following manner. A substrate 1 composed of sapphire was first located in an MOVPE apparatus. The substrate 1 was then held at a temperature of approximately 600° C. which is lower than a single-crystal-growth-temperature. AlN films each having a thickness of approximately 2.5 nm and GaN films each having a thickness of approximately 2.5 nm were alternately laminated in four cycles on the substrate 1 using $H_2$ and $N_2$ as carrier gas and using $NH_3$, trimethylaluminum (TMAl) and trimethylgallium (TMGa) as material gas, to form a first buffer layer 11 having a thickness of approximately 20 nm.

The substrate 1 was then held at a temperature of approximately 1150° C. as the single-crystal-growth-temperature. A second buffer layer 12 having a thickness of approximately 0.1 μm formed of an undoped AlN film in an approximately single crystalline state was formed on the first buffer layer 11 using the above-mentioned carrier gas and using $NH_3$ and TMAl as material gas. It is preferable that the single-crystal-growth-temperature of the undoped AlN film is approximately 1000 to 1200° C.

The substrate 1 was then held at a temperature of approximately 1150° C. as the single-crystal-growth-temperature. An undoped GaN layer having a thickness of approximately 3 μm was formed on the second buffer layer 12 using the above-mentioned carrier gas and using $NH_3$ and TMGa as material gas. It is preferable that the single-crystal-growth-temperature of the undoped GaN layer is approximately 1000 to 1200° C.

Measurement by X-ray diffraction was made on the first sample fabricated in the above-mentioned manner, to examine the full width at half-maximum (FWHM) on an X-ray rocking curve of the undoped GaN layer. The FWHM is changed depending on the crystalline quality of the GaN layer, and the smaller the FWHM is, the better the crystalline quality is. For comparison, a first comparative example fabricated in the same manner as the first sample except that the second buffer layer 12 was not provided was prepared, and the same measurement was also made on the comparative example.

As a result of the measurement, the FWHM on the X-ray rocking curve of the GaN layer in the first sample was approximately 250 seconds. On the other hand, the FWHM in the first comparative example was approximately 290 seconds. Accordingly, it is found that the GaN layer in the first sample has better crystalline quality.

Respective PL spectra in the first sample and the first comparative example were compared with each other. The PL spectrum is changed depending on the crystalline quality of the GaN layer, and the higher the peak intensity thereof is, the better the crystalline quality is.

Figure 2:
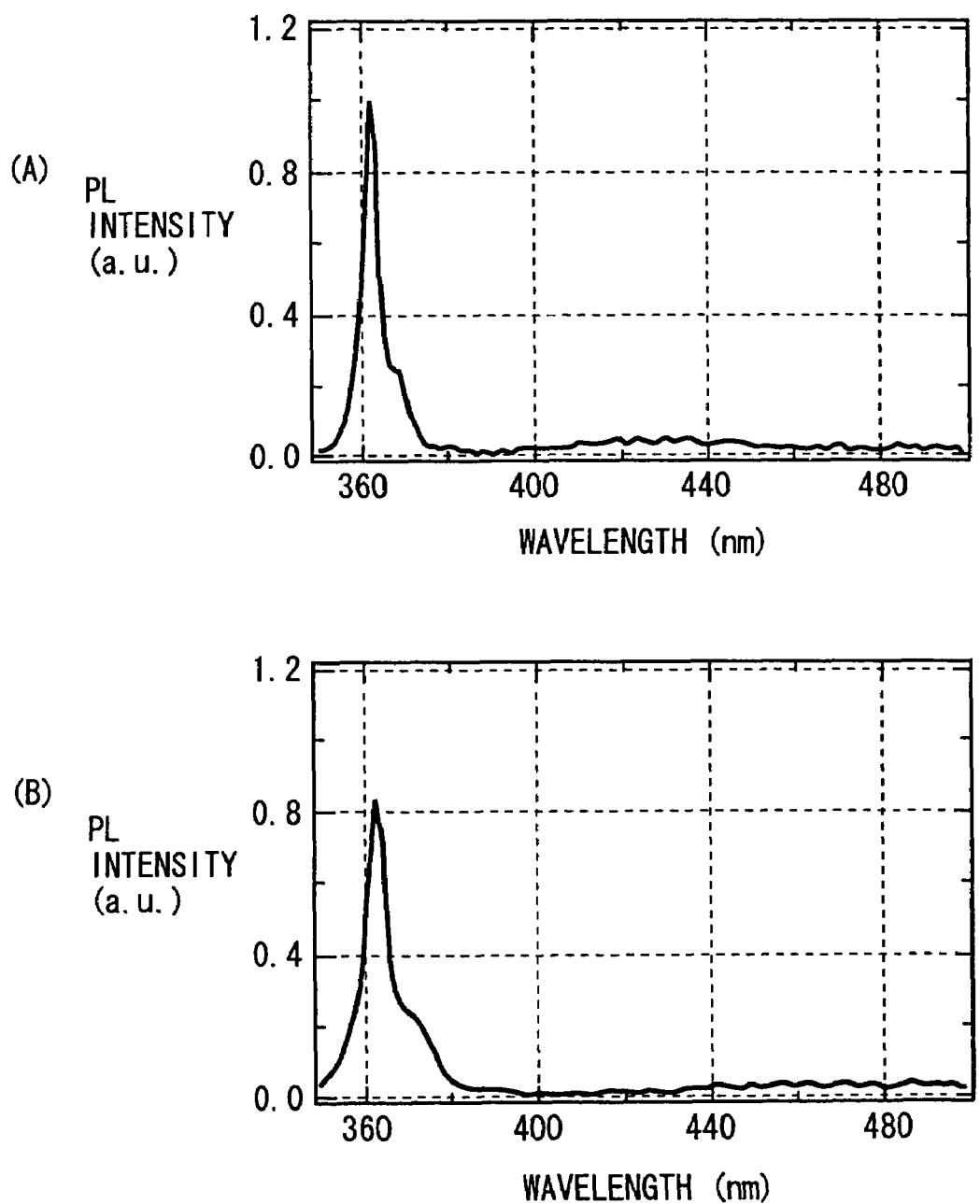
FIG. 2 is a characteristic view showing the results of measurement of a photoluminescence spectrum in each of a first sample according to the first embodiment and a first comparative example.

FIG. 2 is a characteristic view showing the results of measurement of the PL spectrum in each of the first sample and the first comparative example, where FIG. 2(A) shows the results of the measurement in the first sample, and FIG. 2(B) shows the results of the measurement in the first comparative example. As shown in FIG. 2, the peak intensity in the first sample is higher by approximately 20% than the peak intensity in the first comparative example. Accordingly, it is found that the GaN layer in the first sample has the better crystalline quality.

A second sample in the present embodiment was then fabricated in the following manner. An $Al_{0.1}Ga_{0.9}N$ layer having a thickness of approximately 0.5 μm was formed on the undoped GaN layer in the first sample at a temperature of approximately 1150° C. A multiple quantum well (MQW) layer formed by alternately laminating barrier layers each composed of an undoped GaN layer having a thickness of 5 nm and well layers each composed of undoped $Ga_{0.65}In_{0.35}N$ having a thickness of approximately 5 nm, whose total number is 11, and an undoped GaN layer having a thickness of approximately 10 nm were then formed at a temperature of approximately 850° C. Further, an undoped GaN layer having a thickness of approximately 0.15 μm was formed thereon at a temperature of approximately 1150° C., to prepare the second sample.

A PL spectrum was also measured in the second sample, as in the first sample. In the second sample, the PL intensity of the MQW layer is the highest. The crystalline quality of the MQW layer can be evaluated by measuring the PL spectrum. For comparison, a second comparative example fabricated in the same manner as the second sample except that the second buffer layer was not provided was also prepared.

Figure 3:
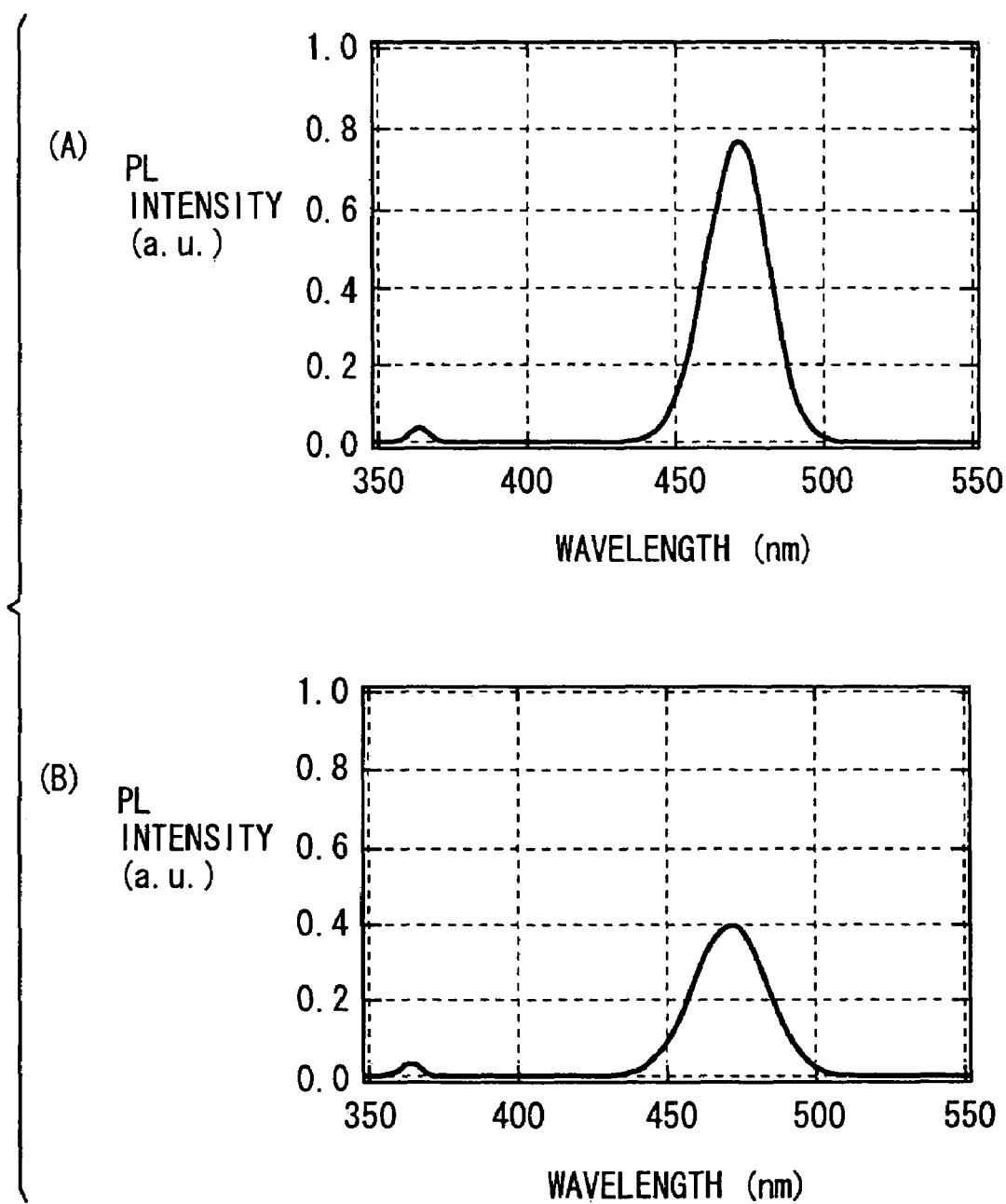
FIG. 3 is a characteristic view showing the results of measurement of a photoluminescence spectrum in each of a second sample according to the first embodiment and a second comparative example.

FIG. 3 is a characteristic view showing the results of measurement of the PL spectrum in each of the second sample and the second comparative example, where FIG. 3(A) shows the results of the measurement in the second sample, and FIG. 3(B) shows the results of the measurement in the second comparative example. As shown in FIG. 3, the peak intensity in the second sample is approximately twice the peak intensity in the second comparative example. Accordingly, it is found that the MQW layer in the second sample has the better crystalline quality.

Figure 4:
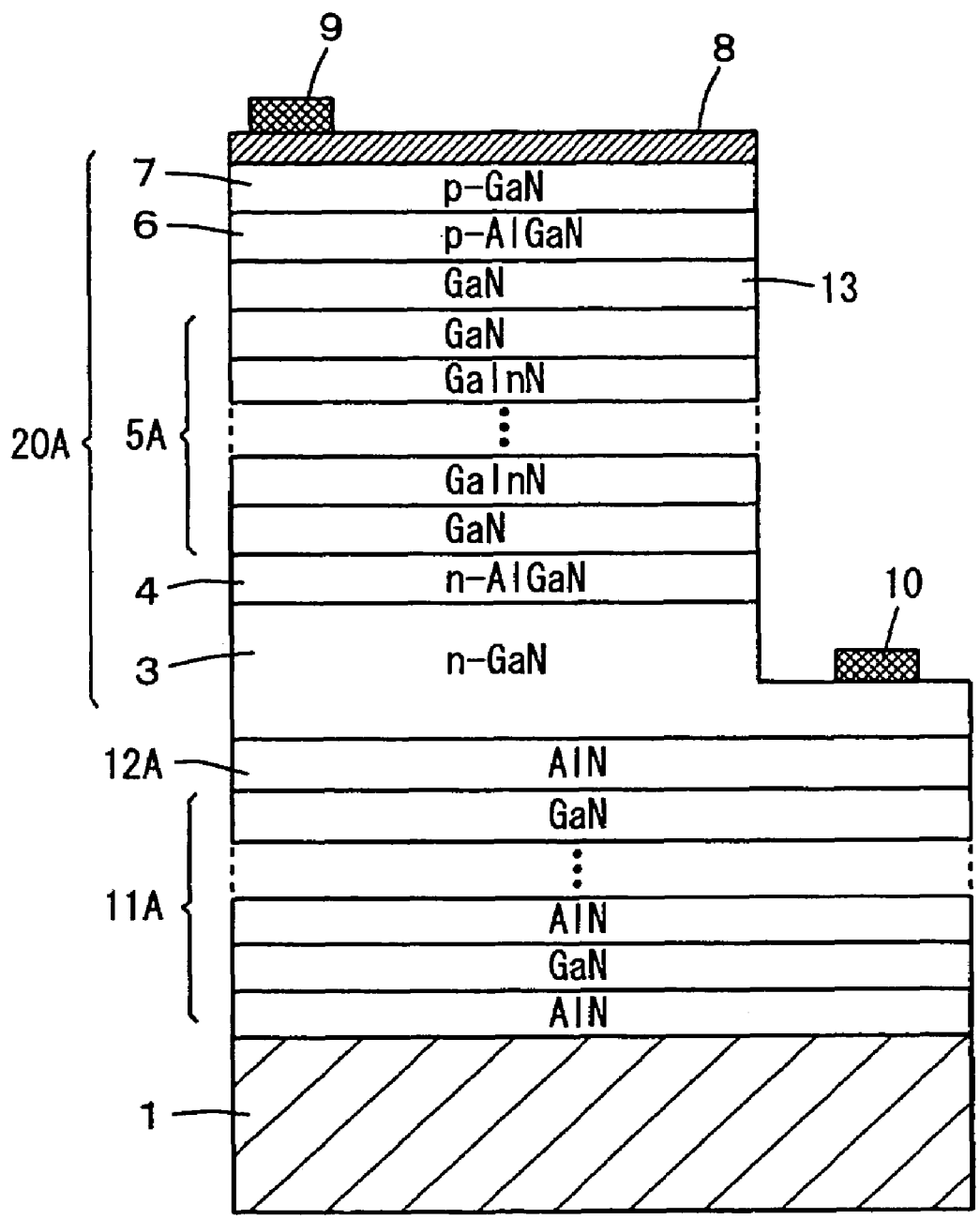
FIG. 4 is a schematic sectional view of a light emitting diode in a second embodiment of the present invention.

A light emitting diode in a second embodiment of the present invention will be described with reference to FIG. 4. The second embodiment is a more specific one of the first embodiment. In FIG. 4, portions having the same functions as those in the light emitting diode shown in FIG. 1 are assigned the same reference numerals.

In the present embodiment, a substrate 1 composed of sapphire is first located in an MOVPE apparatus. The substrate 1 is then held at a temperature of approximately 600° C. which is lower than a single-crystal-growth-temperature. AlN films each having a thickness of approximately 2.5 nm and GaN films each having a thickness of approximately 2.5 nm are alternately laminated in four cycles on the substrate 1 using $H_2$ and $N_2$ as carrier gas and respectively using $NH_3$ and TMAl, and $NH_3$ and TMGa as material gas, to form a first buffer layer 11A having a thickness of approximately 20 nm.

The substrate 1 is then held preferably at a temperature of approximately 1000 to 1200° C., for example, approximately 1150° C. as the single-crystal-growth-temperature. A second buffer layer 12A having a thickness of approximately 0.1 μm composed of undoped AlN in an approximately single crystalline state is formed on the first buffer layer 11A using the above-mentioned carrier gas and using $NH_3$ and TMAl as material gas.

The substrate 1 is then held preferably at a temperature of approximately 1000 to 1200° C., for example, approximately 1150° C. as the single-crystal-growth-temperature. An n-type contact layer 3 composed of n-type GaN having a thickness of 5 μm is directly formed on the second buffer layer 12A using the above-mentioned carrier gas, using $NH_3$ and TMGa as material gas, and using $SiH_4$ as dopant gas. An n-type cladding layer 4 composed of $Al_{0.1}Ga_{0.9}N$ having a thickness of approximately 0.5 μm is formed on the n-type contact layer 3 using the above-mentioned carrier gas, using NH$_3$, TMAl and TMGa as material gas, and using SiH$_4$ as dopant gas.

The substrate 1 is then held at a temperature of approximately 850° C. A light-emitting layer 5A having a multiple quantum well (MQW) structure formed by alternately laminating barrier layers each formed of an undoped GaN layer having a thickness of approximately 5 nm and well layers each composed of undoped Ga$_{0.65}$In$_{0.35}$N having a thickness of approximately 5 nm, whose total number is 11, is formed on the n-type cladding layer 4 using the above-mentioned carrier gas and using NH$_3$, TMGa and trimethylindium (TMIn) as material gas. Further, a protective layer 13 composed of an undoped GaN layer having a thickness of approximately 10 nm is formed on the light-emitting layer 5A.

The substrate 1 is then held at a temperature of approximately 1150° C. A p-type cladding layer 6 having a thickness of approximately 0.15 μm formed of an Mg-doped Al$_{0.05}$Ga$_{0.95}$N layer is formed on the protective layer 13 using the above-mentioned carrier gas, using NH$_3$, TMGa and TMAl as material gas, using bis(cyclopentadienyl) magnesium (Cp$_2$Mg) as dopant gas.

A p-type contact layer 7 having a thickness of approximately 0.3 μm composed of Mg-doped GaN is formed on the p-type cladding layer 6 using the above-mentioned carrier gas, using NH$_3$ and TMGa as material gas, and using Cp$_2$Mg as dopant gas at a temperature of approximately 1150° C. Thereafter, a part of a region from the p-type contact layer 7 to the middle of the n-type contact layer 3 is removed by a method such as reactive ion beam etching.

A p-side electrode 8 having transparency formed of a laminate film of an Ni film and an Au film which are thin films is then formed on a large part of the whole surface of the p-type contact layer 7, and a pad electrode 9 is formed on a part of the p-side electrode 8. Further, an n-side electrode 10 composed of Al is formed on the n-type contact layer 3.

Even in the present embodiment constructed as described above, the crystalline quality of a device-constituting layer 20A can be made better, thereby making it possible to improve the luminous characteristics of the light emitting diode, as in the first embodiment.

The light emitting diode according to the present embodiment was fabricated in the above-mentioned manner. For comparison, a comparative example was prepared in the same manner except that the second buffer layer 12A was not provided in the present embodiment. Luminous intensity in the present embodiment and luminous intensity in the comparative example were compared with each other. In the present embodiment, the luminous intensity was approximately twice that in the comparative example.

Although in the present embodiment, the thickness of the AlN film constituting the second buffer layer 12A is set to approximately 0.1 μm, the thickness of the AlN film may be not less than approximately 5 nm, in which case the crystalline quality of the device-constituting layer 20A formed thereon can be improved. When the thickness of the AlN film is increased, the crystalline quality of the device-constituting layer 20A is improved as the thickness thereof is increased to 500 nm. If the thickness thereof exceeds 500 nm, the crystalline quality is hardly changed. Although in the present embodiment, a multi-layer film comprising the AlN films and the GaN films is used as the first buffer layer 11A, the present invention is not particularly limited to this example. The same single layer film or multi-layer film as that in the first embodiment may be used.

A light emitting diode in a third embodiment of the present invention will be described with reference to FIG. 5. In FIG. 5, portions having the same functions as those in the light emitting diode shown in FIG. 4 are assigned the same reference numerals. The same is true for the following embodiments.

The present embodiment is characterized in that a second buffer layer 12B is formed of a multi-layer film 12B formed by cyclically laminating films having different moduli of elasticity (for example, AlN films and GaN films shown in FIG. 5). When the second buffer layer 12B is formed of the multi-layer film formed by cyclically laminating two or more films having different moduli of elasticity, the direction in which defects are propagated from the second buffer layer 12B to a device-constituting layer 20A can be changed in an in-plane direction in the interface of the multi-layer film. Since the amount of the defects which are propagated to the device-constituting layer 20A can be decreased, therefore, the crystalline quality of the device-constituting layer 20A can be further improved.

Also in the present embodiment, the second buffer layer 12B is formed at a crystal growth temperature, and each of the layers constituting the second buffer layer 12B has an approximately single crystalline state.

It is possible to use as one of the films constituting the second buffer layer 12B a nitride film having a high Al composition ratio, for example, an AlGaN film containing a very small amount of Ga in addition to the above-mentioned AlN film, and use as the other film a nitride film having a high Ga composition ratio, for example, a GaAlN film containing a very small amount of Al in addition to the above-mentioned GaN film.

As the second buffer layer 12B, the nitride films having a high Al composition ratio and the nitride films having a high Ga composition ratio may be alternately laminated. Further, the thickness of the nitride film having a high Al composition ratio and the thickness of the nitride film having a high Ga composition ratio may be gradually decreased and increased, respectively, in the thickness direction. In this case, the average composition in the thickness direction can be gradually changed from a composition close to AlN to a composition close to GaN. Accordingly, lattice mismatching between the second buffer layer 12B and the device-constituting layer 20A can be alleviated. As a result, it is possible to further improve the crystalline quality of the device-constituting layer 20A.

As an example of the above-mentioned third embodiment, a light emitting diode using AlN films and GaN films, as illustrated, as the second buffer layer 12B will be described in detail. The second buffer layer 12B in this example is formed of a laminate film formed by cyclically laminating AlN films each having a thickness of approximately 2.5 nm and GaN films each having a thickness of approximately 2.5 nm at a single-crystal-growth-temperature.

Since the AlN film and the GaN film have different moduli of elasticity, the direction in which defects in the second buffer layer 12B are propagated can be changed in an in-plane direction in the interface of the AlN film and the GaN film also in this example. Therefore, the amount of defects which are propagated to the device-constituting layer 20A can be reduced, thereby making it possible to further improve the crystalline quality of the device-constituting layer 20A.

The light emitting diode in this example was fabricated, and the luminous intensity thereof was measured. In the light emitting diode in this example, the luminous intensity was not less than approximately twice that in the conventional light emitting diode.

Although in this example, the order in which the AlN film and the GaN film are formed is not particularly limited, superior luminous characteristics can be obtained if the AlN film is first formed on a first buffer layer 11A, and the GaN film is then formed thereon. The respective thicknesses of the AlN film and the GaN film which constitute the second buffer layer 12B need not be necessarily the same. If the thickness of the AlN film is not less than approximately 0.5 nm, and the thickness of the GaN film is not less than approximately 0.5 nm nor more than 0.1 μm, the effect of the present invention is produced. Although the cycle of a multi-layer structure may be one, it is preferably not less than five.

A light emitting diode in a fourth embodiment of the present invention will be described with reference to FIG. 6.

Figure 6:
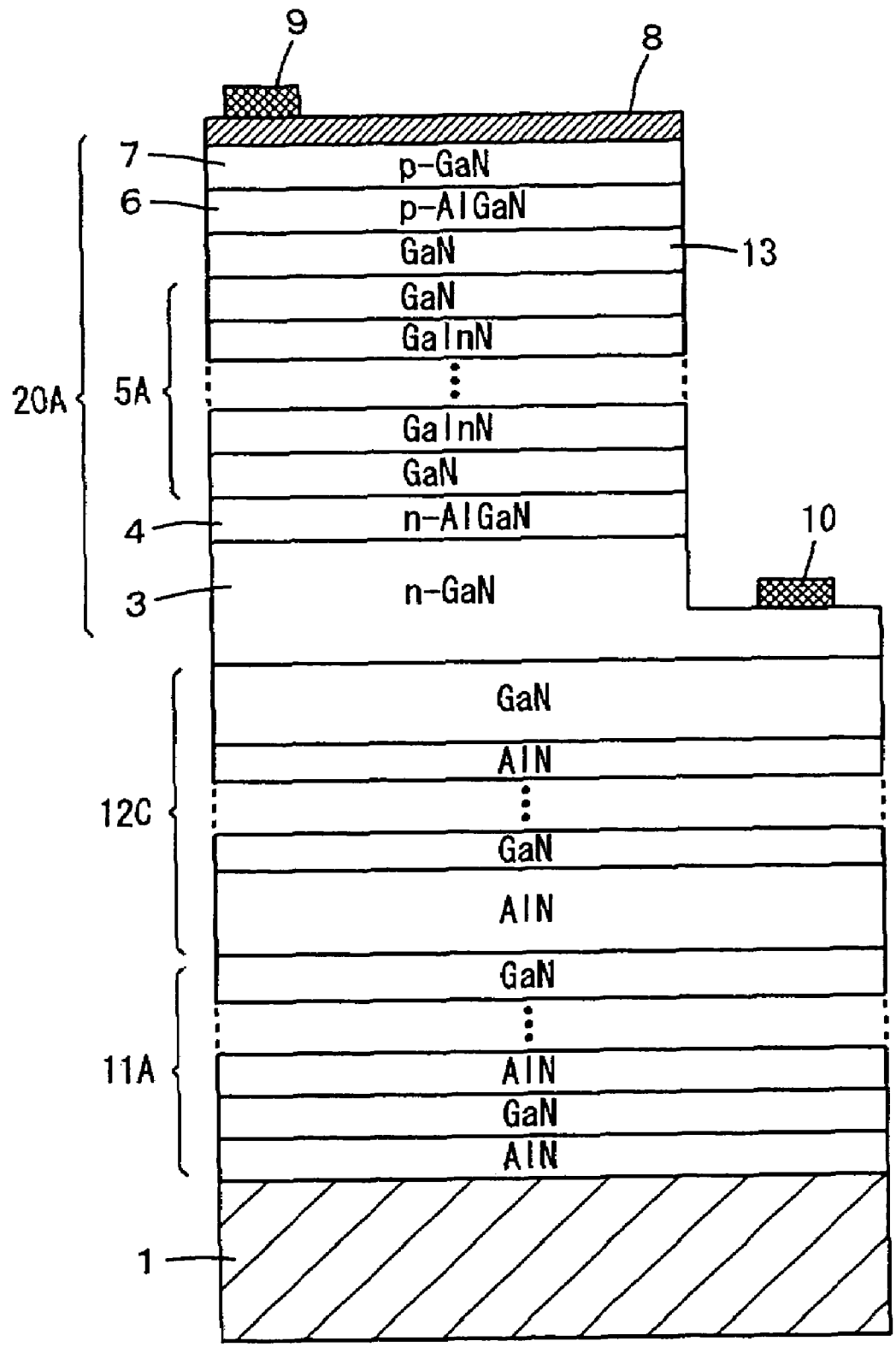
FIG. 6 is a schematic sectional view of a light emitting diode in a fourth embodiment of the present invention.

The light emitting diode shown in FIG. 6 differs from the light emitting diode shown in FIG. 5 in that the thicknesses of an AlN film and a GaN film which constitute a second buffer layer 12C are gradually decreased and increased, respectively, in a direction from a first buffer layer 11A to a device-constituting layer 20A.

In this case, the average composition along the thickness of the second buffer layer 12C can be gradually changed from a composition close to AlN to a composition close to GaN. Consequently, lattice mismatching between the first buffer layer 11A and the device-constituting layer 20A can be alleviated, thereby making it possible to further improve the crystalline quality of the device-constituting layer 20A.

Figure 7:
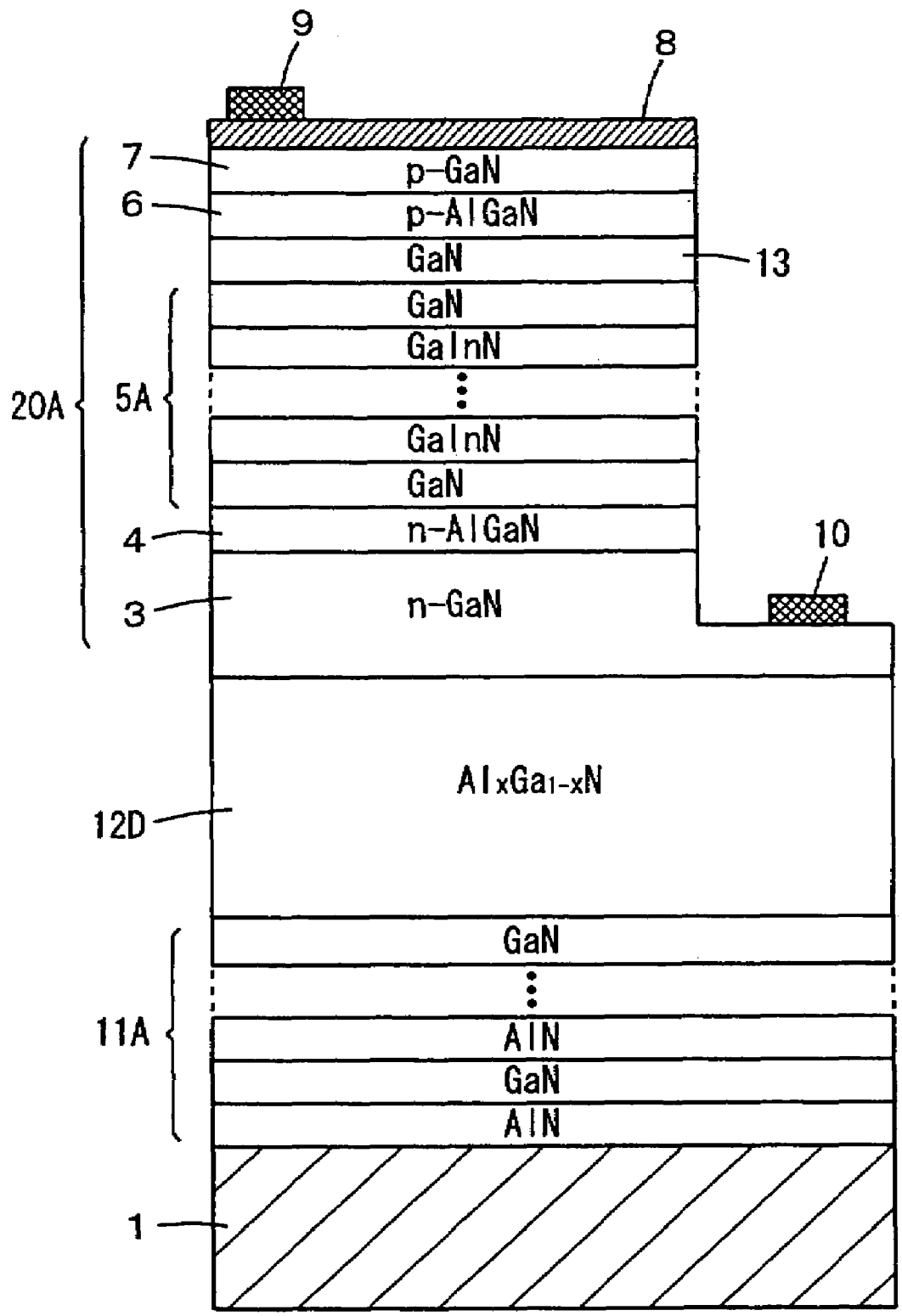
FIG. 7 is a schematic sectional view of a light emitting diode in a fifth embodiment of the present invention.

A light emitting diode in a fifth embodiment of the present invention will be described with reference to FIG. 7.

In the present embodiment, a second buffer layer 12D has a composition distribution in which Al and Ga respectively decreases and increases in a direction from a first buffer layer 11A to a device-constituting layer 20A. A composition ratio x of a nitride expressed by $Al_{1-x}Ga_xN$ (0 x 1) gradually increases in the direction from the first buffer layer 11A to the device-constituting layer 20A. In this case, lattice mismatching between the first buffer layer 11A and the device-constituting layer 20A can be alleviated, thereby making it possible to further improve the crystalline quality of the device-constituting layer 20A.

Also in the present embodiment, the second buffer layer 12D is formed at a single-crystal-growth-temperature. The composition of the second buffer layer 12D need not be necessarily changed from AlN to GaN. It may be changed from a composition having a high Al composition ratio to a composition having a high Ga composition ratio.

Figure 8:
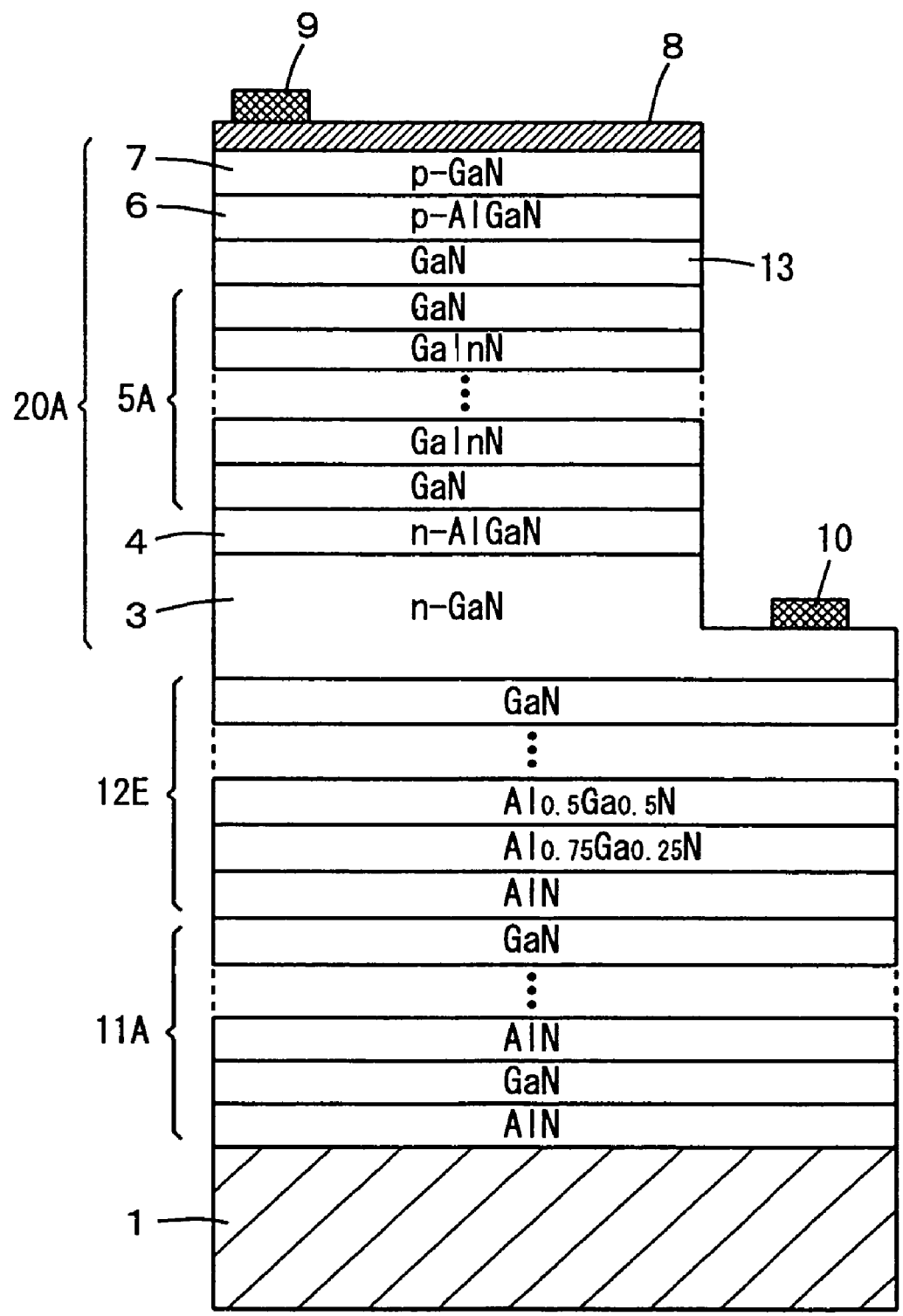
FIG. 8 is a schematic sectional view of a light emitting diode in a sixth embodiment of the present invention.

A light emitting diode in a sixth embodiment of the present invention will be described with reference to FIG. 8.

Although in the light emitting diode according to the fourth embodiment, the second buffer layer 12C is formed of a cyclic laminate structure, and the thickness thereof is changed, the composition along the thickness of a second buffer layer 12E is gradually changed from AlN to GaN in the present embodiment. That is, in the present embodiment, an AlN film having a thickness of approximately 2.5 nm, an $Al_{0.75}Ga_{0.25}N$ film having a thickness of approximately 2.5 nm, an $Al_{0.5}Ga_{0.5}N$ film having a thickness of approximately 2.5 nm, an $Al_{0.25}Ga_{0.75}N$ film having a thickness of approximately 2.5 nm, and a GaN film having a thickness of approximately 2.5 nm are successively laminated on a first buffer layer 11A at a single-crystal-growth-temperature, to form the second buffer layer 12E.

Even by the above-mentioned construction, lattice mismatching between the second buffer layer 12E and a device-constituting layer 20A can be alleviated, thereby making it possible to further improve the crystalline quality of the device-constituting layer 20A.

The light emitting diode in the present embodiment was fabricated, and the luminous intensity thereof was measured. Also in the light emitting diode in the present embodiment, the luminous intensity was not less than approximately twice that in the conventional light emitting diode.

The composition along the thickness of the second buffer layer 12E may be changed in stages, as described above, or may be continuously changed. The composition of the second buffer layer 12E need not be changed from AlN to GaN as in the present embodiment. It may be changed from a composition having a high Al composition ratio to a composition having a high Ga composition ratio.

As described above, in each of the above-mentioned embodiments, the crystalline quality of the device-constituting layer composed of the nitride semiconductor can be improved, thereby making it possible for the provided semiconductor device to have superior device characteristics.

Three types of second buffer layers which are formed at the single-crystal-growth-temperature, that is, a second buffer layer composed of a nitride containing neither Ga nor In (a second buffer layer having a first structure), a second buffer layer formed of a layer obtained by cyclically laminating two or more thin films having different moduli of elasticity (a second buffer layer having a second structure), and a second buffer layer formed of a film having a composition distribution in which an Al composition ratio decreases and a Ga composition ratio increases in a direction from a first buffer layer to a device-constituting layer (a second buffer layer having a third structure) can be used in combination.

Specifically, the second buffer layer having the first structure and the second buffer layer having the second structure may be used in combination, or the second buffer layer having the first structure and the second buffer layer having the third structure may be used in combination. Alternatively, the second buffer layer having the second structure and the second buffer layer having the third structure may be used in combination. The same effect as the above-mentioned effect can be produced even by any one of the combinations.

For example, when the second buffer layer having the first structure is first formed on the first buffer layer, the second buffer layer having the second structure is then formed thereon, and the device-constituting layer is then formed, the second buffer layer having the first structure has good crystalline quality, and the propagation of a few defects existing in the second buffer layer can be reduced by the second buffer layer having the second structure. Therefore, it is possible for the device-constituting layer to have better crystalline quality.

Furthermore, when the second buffer layer having the first structure is first formed on the first buffer layer, the second buffer layer having the third structure is then formed thereon, and the device-constituting layer is then formed thereon, the second buffer layer having the first structure has good crystalline quality, and lattice mismatching between the second buffer layer having the first structure and the device-constituting layer can be alleviated by the second buffer layer having the third structure. Therefore, it is possible for the device-constituting layer to have better crystalline quality.

Additionally, when the second buffer layer having the second structure is first formed on the first buffer layer, the second buffer layer having the third structure is then formed thereon, and the device-constituting layer is then formed, the propagation of defects to the device-constituting layer can be reduced by the second buffer layer having the second structure, and lattice mismatching between the second buffer layer having the second structure and the device-constituting layer can be alleviated by the second buffer layer having the third structure. Therefore, it is possible for the device-constituting layer to have better crystalline quality.

As an example of a combination of the second buffer layers, a light emitting diode in a seventh embodiment of the present invention will be described with reference to FIG. 9.

Figure 9:
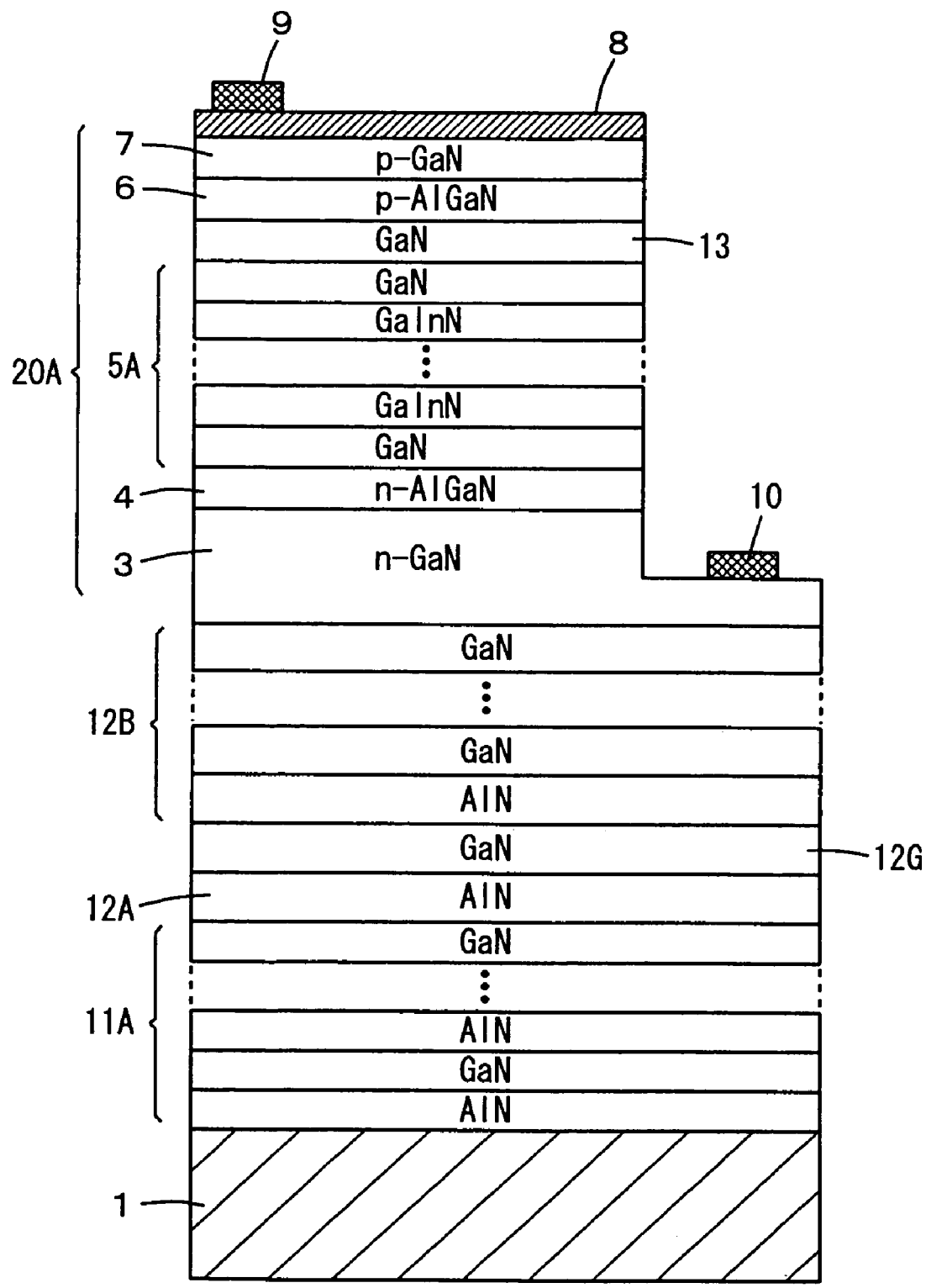
FIG. 9 is a schematic sectional view of a light emitting diode in a seventh embodiment of the present invention.
Figure 10:
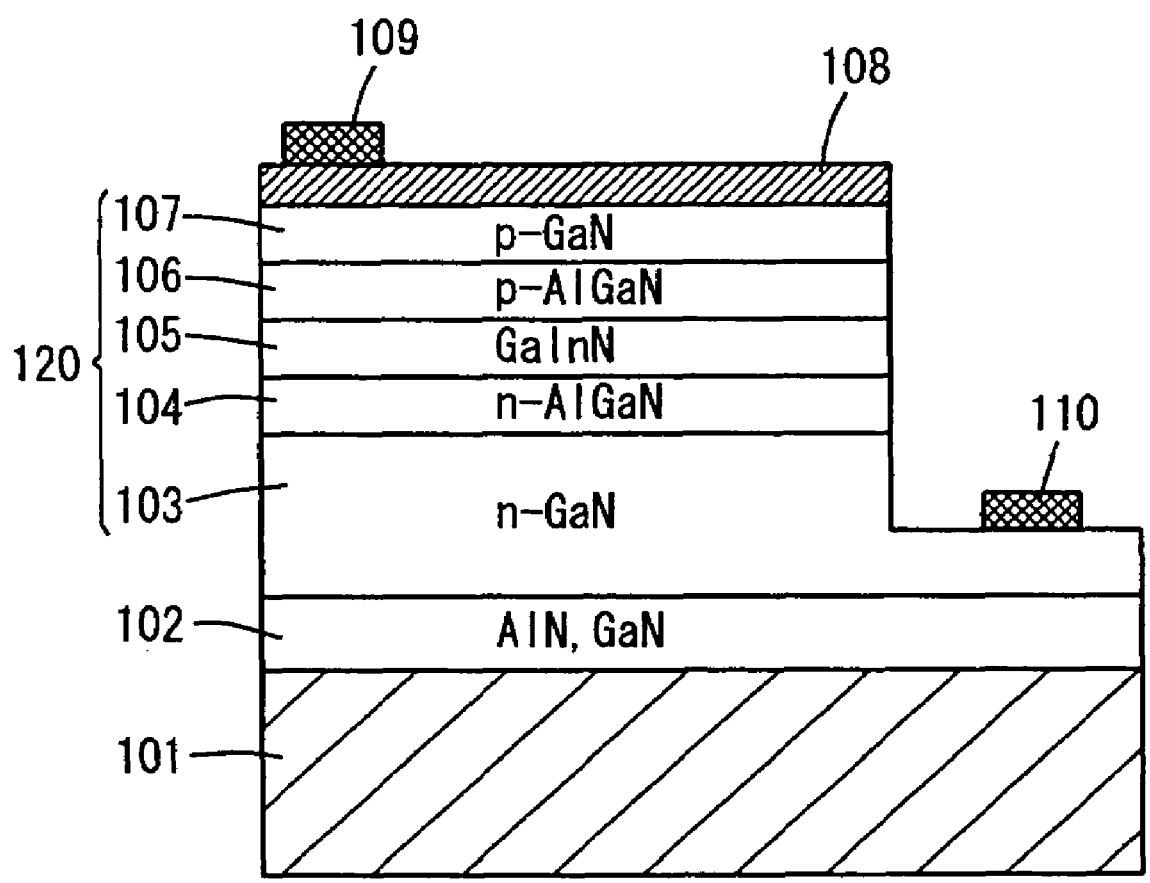
FIG. 10 is a schematic sectional view of a conventional light emitting diode.

As shown in FIG. 9, an AlN film having a thickness of approximately 0.1 μm is formed on a first buffer layer 11A at a single-crystal-growth-temperature, to form a second buffer layer 12A having the first structure. AlN films each having a thickness of approximately 2.5 nm and GaN films each having a thickness of approximately 2.5 nm are alternately laminated through a GaN film 12G having a thickness of approximately 0.1 μm on the second buffer layer 12A at the single-crystal-growth-temperature, to form a second buffer layer 12B having the second structure. Further, a device-constituting layer 20A is formed on the second buffer layer 12B.

According to the above-mentioned construction, the second buffer layer 12A having the first structure has good crystalline quality, and the propagation of a few defects existing in the second buffer layer 12A can be reduced by the second buffer layer 12B having the second structure. As a result, it is possible for the device-constituting layer 20A to have good crystalline quality, thereby making it possible to improve the characteristics of the light emitting diode.

The following are the reason why the second buffer layer 12B having the second structure is provided on the second buffer layer 12A having the first structure through the GaN film 12G.

Specifically, when the GaN film 12G is not provided, the crystalline quality of the device-constituting layer 20A is slightly degraded due to lattice mismatching caused by the difference in the lattice constant between the second buffer layer 12A having the first structure and the device-constituting layer 20A.

On the other hand, according to the above-mentioned construction, the difference in the lattice constant between the GaN film 12G and the device-constituting layer 20A is small, thereby making it possible to reduce above-mentioned degradation caused by the lattice mismatching. In this construction, it is considered that the defects are induced-in the GaN film 12G due to the lattice mismatching between the second buffer layer 12A having the first structure and the GaN film 12G. However, the propagation of the defects can be reduced by the insertion of the second buffer layer 12B having the second structure. Consequently, it is possible for the device-constituting layer 20A to have good crystalline quality.

The first buffer layer in each of the above-mentioned embodiments is not limited to the structure described in each of the embodiments, provided that it is formed at a lower temperature than the single-crystal-growth-temperature. For example, it can be formed of a single layer film or a multi-layer film composed of a nitride semiconductor containing at least one of Al, Ga, In, B and Tl, for example, AlN, AlGaN, GaN, GaInN and AlGaInN, SiC or ZnO which is formed at a lower temperature than the single-crystal-growth-temperature.

The crystal structure of the nitride semiconductor used as the device-constituting layer may be either a wurtzite structure or a zinc-blende structure.

Although description was made of the light emitting diode which is a light emitting element as a semiconductor device, the present invention is also applicable to any semiconductor device, provided that the semiconductor device has a device-constituting layer composed of a nitride semiconductor on a substrate. For example, it is similarly applicable to semiconductor devices such as a laser diode, a photodiode, and a transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising in the following order:
   a substrate;
   a first buffer layer composed of a multi-layer film;
   a second buffer layer in an approximately single crystalline state composed of a nitride containing neither Ga nor In; and
   a device-constituting layer composed of a nitride semiconductor,
   wherein each of the layers of said first buffer layer is in a non-single crystalline state.

2. The semiconductor device according to claim 1, wherein said second buffer layer is composed of $A_{1-x}B_xN$ ($0 \leq x \leq 1$).

3. The semiconductor device according to claim 1, wherein said first buffer layer is formed of a multi-layer film composed of a nitride containing at least one of Al, Ga, In, B and Tl, SiC or ZnO.

4. The semiconductor device according to claim 1, wherein said first buffer layer is composed of a multi-layer film composed of AlN, AlGaN, GaN, GaInN, AlGaInN, SiC or ZnO.

* * * * *